United States Patent [19]

Feistel et al.

[11] 3,996,530
[45] Dec. 7, 1976

[54] BUTLER OSCILLATOR

[75] Inventors: Claude Herbert Feistel, Austin, Tex.; Philip Theodore Gianos, Boulder, Colo.

[73] Assignee: International Business Machines Corporation, Armonk, N.Y.

[22] Filed: June 30, 1975

[21] Appl. No.: 591,592

[52] U.S. Cl. .......................... 331/116 R; 331/109; 331/159
[51] Int. Cl.² ........................................ H03B 5/36
[58] Field of Search ........... 331/109, 116 R, 117 R, 331/159, 168

[56] References Cited
UNITED STATES PATENTS

| | | | |
|---|---|---|---|
| 2,912,654 | 11/1959 | Hansen | 331/116 |
| 3,015,785 | 1/1962 | Vass | 331/117 |
| 3,026,487 | 3/1962 | Walsh et al. | 331/61 |
| 3,239,776 | 3/1966 | Shaw | 331/109 |
| 3,319,186 | 5/1967 | Lam | 331/116 |
| 3,649,850 | 3/1972 | Davis | 331/116 |

OTHER PUBLICATIONS

IBM Tech. Disc. Bul. "Sym. Square-Wave Output Crystal Osc." J. S. Chomicki, vol. 8, No. 4, Sept. 1965.
IBM Tech. Disc. Bul. "Oscillator", Neal et al. vol. 11, No. 5, Oct. 1968.
IBM Tech. Disc. Bul. "Crystal Osc.", Evans vol. 9, No. 2 July 1966.

*Primary Examiner*—John Kominski
*Attorney, Agent, or Firm*—Douglas H. Lefeve

[57] ABSTRACT

An amplitude limiting amplifier followed by a filter network is interposed between the voltage amplification stage and the impedance matching stage in a Butler oscillator. This allows both the voltage amplification stage and the impedance matching stage to be operated in a linear mode at all times which assures that a piezoelectric crystal connected between the stages is connected in a relatively low, constant impedance path and is driven by a sinusoidal waveform, free of distortion, to assure maximum frequency stability.

9 Claims, 2 Drawing Figures

BUTLER OSCILLATOR

BACKGROUND OF THE INVENTION

1. Field of the Invention

This invention relates generally to oscillators and more particularly to an improved Butler oscillator in which a high Q, series resonant circuit, such as a piezoelectric crystal is included in a substantially low, constant impedance path and is driven by a non-distorted waveform to achieve superior frequency stability.

2. Description of the Prior Art

In a Butler oscillator a piezoelectric crystal or other high Q, series resonant circuit is interposed in a feedback loop between the input of a voltage amplification stage capable of providing gain in excess of unity and the output of an impedance matching stage. In transistor circuitry the Butler oscillator is implemented by driving an emitter follower (impedance matching) stage with a common base (voltage amplifier) stage. A crystal is interposed between emitters of the two transistors.

The Butler oscillator utilizes the series resonant frequency rather than the parallel resonant frequency of the crystal or equivalent circuit. From the standpoint of frequency stability, the highest stability is attained by operating the crystal in the series resonant mode, because the crystal is not nearly as susceptible to stray circuit capacitance to alter the effective resonant frequency thereof as it would be if operated in the parallel resonant mode.

Another advantage of the Butler oscillator is that the crystal is included in a relatively low impedance path. Since the series impedance of the crystal is relatively low at the series resonant frequency, the Q is maintained at a relatively high level by operating the crystal in a relatively low impedance path. The effective circuit Q would be lowered by operation of the crystal in a series resonant mode in a relatively high impedance path. Higher frequency stability of the oscillator is attained by operation of the crystal in a circuit of the highest attainable Q, since the higher the Q, the more closely the crystal oscillates relative to its true, natural resonant frequency.

Not only should the impedance of the path in which the crystal or equivalent high Q, series resonant circuit is connected be as low as possible, but this impedance should also remain constant. If the impedance changes then harmonic distortion is generated in the crystal drive circuit which, in turn, contributes to frequency instability. Further, to the extent that these impedances rise above their minimum value, the Q of the crystal circuit is reduced.

For optimum frequency stability the crystal should be driven only by a sine wave, because the presence of distortion comprising any harmonic power content in the drive waveform to the crystal will contribute to instability which is proportional to the degree of distortion in the drive waveform.

In the most conventional prior art Butler oscillator circuits it has been impossible to assure that the crystal is connected in a path having a constant circuit impedance, although circuit improvements have been offered to correct this problem with the trade-off of other, severe design limitations. It has also been impossible to assure that the crystal is driven by a relatively pure sinusoidal waveform. For superior frequency stability owing to circuit design, therefore, it would be advantageous to provide an improved Butler oscillator circuit in which the crystal is connected between constant, relatively low impedances and is driven only by a relatively pure sinusoidal waveform.

SUMMARY OF THE INVENTION

Accordingly, the frequency stability of a conventional Butler oscillator circuit is vastly improved by the addition of an amplitude limiting amplifier and a filter network interposed between the output of the amplification stage and the input of the impedance matching stage of the conventional Butler oscillator. In a transistorized embodiment of the oscillator the amplitude limiting amplifier has an input connected to the output of a common base, voltage amplification stage of the Butler oscillator. The output of the amplitude limiting amplifier is a distorted, non-sinusoidal waveform and is, therefore, smoothed into a sine wave by the filter network before application to the input of the emitter follower, impedance matching stage of the Butler oscillator. In the preferred embodiment an attenuation network reduces the level of the sine wave applied to the input of the emitter follower, impedance matching stage, further assuring that both the emitter follower and the common base amplifier operate, at all times, in a linear mode with neither cutoff nor saturation ever occuring. This, in turn, assures superior frequency stability by assuring that the crystal or other high Q, series resonant circuit is situated between constant impedances and is driven only by a sine wave.

The foregoing and other objects, features, and advantages of the invention will be apparent from the following more particular description of a preferred embodiment of the invention, as illustrated in the accompanying drawing.

DETAILED DESCRIPTION OF THE PREFERRED EMBODIMENT

Figure 1:
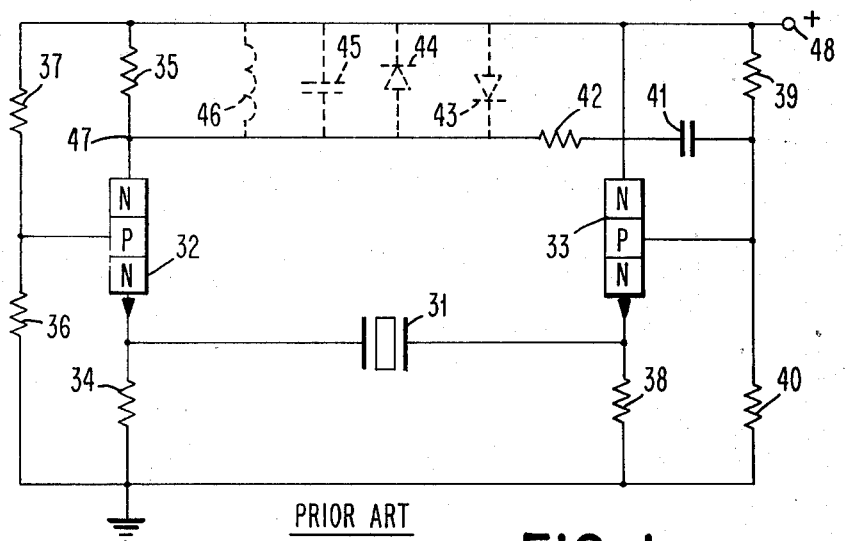
FIG. 1 is a schematic diagram of a conventional, prior art Butler oscillator circuit.

Referring now to FIG. 1, a conventional, prior art Butler oscillator circuit is shown. The common base, voltage amplifier stage including transistor 32 has a gain in excess of unity. Resistors 34, 35, 36, and 37 are used to bias transistor 32 relative to a desired operating point. The output of this amplifier stage is taken from node 47 through resistor 42 and capacitor 41 and is applied to the base of an emitter follower, impedance matching stage including transistor 33. For the present analysis the resistance of resistor 42 can be considered to be negligible and the capacitance of capacitor 41 is considered to be of a high enough value that the impedance thereof is substantially zero around the operating frequency of this oscillator circuit. Resistors 38, 39, and 40 are used to bias transistor 33 to appropriately set the operating point thereof. A crystal 31 or other high Q, series resonant circuit is interposed between the emitter terminals of transistors 32 and 33.

It is understood by those skilled in the art that the basic circuit shown in FIG. 1 meets the criteria necessary for a circuit to oscillate. That is, the loop voltage gain of the circuit exceeds unity and the loop phase shift of the circuit is substantially 0° or substantially some multiple of 360°. Applying these criteria to the circuit of FIG. 1 and starting at the emitter of transistor 32, the phase shift through the common base amplifier including transistor 32 is substantially zero while the voltage gain through this amplification stage can be relatively high and certainly well in excess of unity. Substantially no phase shift is encountered as the signal passes through the negligible impedances of resistor 42 and capacitor 41. The phase shift of the impedance matching stage comprising the emitter follower including transistor 33 is also substantially zero. With crystal 31 operating at its resonant frequency in the series resonant mode the impedance thereof is very low and is substantially resistive, such that the phase shift therethrough is substantially zero. Thus, beginning at the emitter of transistor 32 and proceeding clockwise around the loop formed by transistor 32, resistor 42, capacitor 41, transistor 33, and crystal 31, the loop voltage gain exceeds unity and the loop phase shift is substantially zero. It is understood that the impedance matching network including transistor 33 operated in the emitter follower configuration has a voltage gain of less than unity; however, the voltage gain of the amplifier stage including transistor 32 can be set to a high enough value above unity such that the total loop voltage gain exceeds unity.

One of the problems encountered in utilizing the basic circuit described above is that the crystal 31 sometimes operates at a multiple (usually an odd multiple) of its natural resonant frequency. Occasionally, depending upon the particular structural configuration of the crystal, operation at a spurious frequency may occur that is not associated with its natural resonant frequency or a harmonic thereof. For this reason a parallel resonant tank circuit including capacitor 45 and inductor 46 has sometimes been added between node 47 and an A.C. ground point which may, for example, be the positive power source terminal 48. This tank circuit offers a low impedance to A.C. ground relative to any frequency components that are not at the chosen operating frequency of the oscillator circuit, while a substantially higher impedance is presented by the tank circuit between node 47 and A.C. ground at the operating frequency by virtue of the high impedance characteristics of a parallel resonant tank circuit operated at its resonant frequency. The Q of the tank circuit is relatively low to assure maximum oscillation frequency control by the crystal and resistor 35 serves to lower tank circuit Q by substantially lowering the otherwise high impedance of the tank circuit at the resonant frequency.

Another problem encountered with the prior art Butler oscillator circuit of FIG. 1 is that the amplified signal applied to the base of transistor 33 and then to the emitter of transistor 32 through crystal 31 may be of a great enough magnitude that either of transistors 32 or 33 can cut off or transistor 32 can saturate. When either cutoff or saturation occurs relative to either of these transistors, the impedance at the emitters of these transistors changes which, in turn, causes frequency stability problems as discussed above. These stability problems are caused, at least in part, by the increased sensitivity of the circuit to temperature and power supply voltage variations when the circuit components are operated in nonlinear modes.

Nonlinear operation of either of the transistors 32 or 33 also causes the voltage waveform applied to crystal 31 to be distorted, that is, nonsinusoidal. Again, as discussed above, application of a nonsinusoidal waveform to the crystal 31 causes some degree of frequency instability that is not present when the waveform is a pure sinusoid. In an attempt to relieve both of these problems caused by nonlinear operation of the transistors 32 or 33, a parallel pair of oppositely connected diodes 43 and 44 have been connected between node 47 and A.C. ground to clip the waveform applied to the base of transistor 33 such that the peak-to-peak voltage of this waveform is twice the forward voltage drop of the chosen diodes. Further, the resistance of resistor 42 can be raised above a negligible value and chosen in accordance with resistor 40 to voltage divide the magnitude of the waveform applied to the base of transistor 33. The addition of the diodes and the appropriate choice of resistor 42 can prevent both of transistors 32 and 33 from operating in a nonlinear region by way of saturation or cutoff. However, because the waveform applied to transistor 33 is clipped, the output signal from transistor 33 applied to crystal 31 is no longer a pure sinusoidal waveform but is now a clipped, distorted waveform. Therefore, frequency instability is experienced because the crystal is still driven by a distorted, nonsinusoidal waveform. Further, the circuit requires relatively close tolerances of all components to achieve adequate loop gain and to prevent nonlinear operation of the transistors. The close tolerances required can be particularly troublesome when it is desired to implement the oscillator in integrated circuitry or for operation at low power levels.

Figure 2:
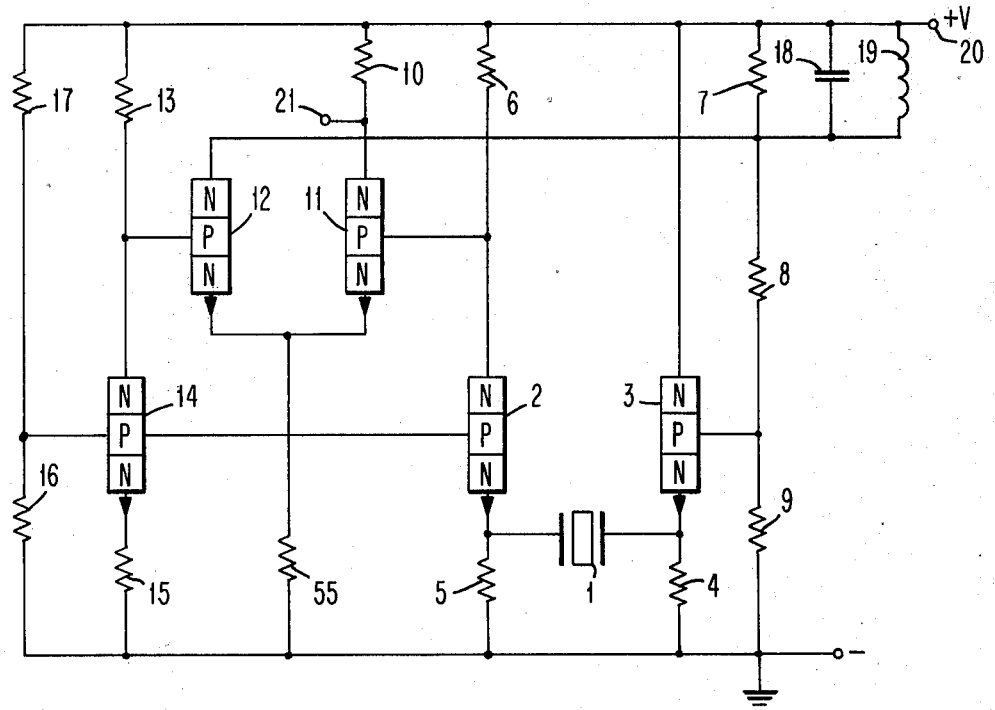
FIG. 2 is a schematic diagram of the improved Butler oscillator circuit of this invention for achieving superior frequency stability.

Referring now to FIG. 2 the improved oscillator is shown which overcomes all of the above-mentioned problems that have been experienced with the conventional Butler oscillator. An amplification stage having a voltage gain in excess of unity includes transistor 2 operated in common base configuration. An impedance matching stage includes transistor 3 operated as an emitter follower. A crystal 1 or other high Q, series resonant circuit is interposed between the emitters of these two transistors. The base of transistor 2 is biased by the voltage divider including resistors 16 and 17 while the base of transistor 3 is biased by the voltage divider including resistors 8 and 9.

Included in the improved Butler oscillator circuit is a differential amplifier comprising transistors 11 and 12. One input of the differential amplifier, the base of transistor 11, is connected to the output of the amplifier stage including transistor 2, while the other input of the differential amplifier, the base of transistor 12, is connected to the output of another stage configured and biased identically to the voltage amplifier stage including transistor 2. This other stage includes transistor 14 which is biased by resistors 13 and 15 having resistance values equal to resistors 6 and 5, respectively, and by resistors 16 and 17 that are also used to bias transistor 2. The base of transistor 11 is biased in accordance with the supply voltage path through resistor 6, transistor 2, and resistor 5. Resistor 10, connected between the collector of transistor 11 and the positive power source terminal 20, is the collector load resistor for transistor 11. The emitters of transistors 11 and 12 are connected together and returned to ground through resistor 55 which may be adjusted to vary the magnitude of the output waveforms from the differential amplifier.

For an analysis of the improved Butler oscillator circuit of FIG. 2 assume that an alternating current signal of relatively small magnitude is present at the emitter of transistor 2. The voltage of this signal is amplified by transistor 2 and is applied to the base of transistor 11. Any deviation of the magnitude of the signal at the emitter of transistor 2 causes the amplified signal applied to the base of transistor 11 to drive the voltage at the output terminal 21 of the differential amplifier in the opposite direction. Along with this opposite deviation of the collector voltage of transistor 11 with respect to the emitter voltage of transistor 2 is a deviation in the collector voltage of transistor 12 in phase with the deviation of the emitter and collector voltages of transistor 2. The A.C. voltage at the emitter of transistor 2 that is amplified by transistor 2 and applied to the base of transistor 11 easily causes alternating heavy conduction and cutoff in transistor 11. Thus, the collector voltage waveform of the transistor 11 is substantially a square wave. When it is desired to use the circuit of this invention as a stable square wave oscillator, for example for clocking digital logic, the output terminal 21 is a convenient output terminal from the oscillator for providing a square wave output signal.

The collector voltage waveform of transistor 12 which is 180° out of phase with the collector voltage waveform of transistor 11 and in phase with voltage at the emitter of transistor 2 is applied to a parallel resonant tank circuit including capacitor 18 and inductor 19 connected between the collector of transistor 12 and the positive power supply terminal 20 which is at A.C. ground. The collector current waveform of transistor 12 which is a square wave is, therefore, smoothed into a sinusoidal voltage waveform by the parallel resonant tank circuit. All spurious frequencies and harmonics of the desired operating frequency are eliminated by the tank circuit. A resistor 7 is included across the tank circuit to lower the Q thereof to prevent any frequency instability of the oscillator circuit due to pulling by the tank circuit.

The voltage of this sinusoidal waveform at the tank circuit is divided by the voltage divider including resistors 8 and 9 and is applied, at an attenuated level, to the base of the impedance matching stage including transistor 3 operated in the emitter follower configuration. It is, therefore, apparent that an appropriately low level, pure sinusoidal waveform is now applied to the base of transistor 3 such that both transistor 3 and 2 are now continuously operated in a linear mode, neither saturating nor cutting off, and the voltage applied to the crystal 1 by transistor 3 is a pure, non-distorted sinusoidal voltage.

By virtue of the continuously linear operation of transistors 2 and 3, crystal 1 is connected in a circuit path having a constant, relatively low impedance which, as discussed above, contributes to frequency stability. Crystal 1 is also driven only by a pure sinusoidal waveform which also enhances frequency stability. It is, therefore, apparent to those skilled in the art that the addition of the amplitude limiting amplifier stage followed by a filtering stage allows operation of the oscillator circuit to provide greatly enhanced frequency stability. The circuit also easily lends itself to implementation in integrated circuitry with no critical tolerance considerations.

While the invention has been particularly shown and described with reference to a preferred embodiment thereof, it will be understood by those skilled in the art that various changes in form and detail may be made therein without departing from the spirit and scope of the invention. For example, it is clear that the crystal could be replaced with other known forms of high Q, series resonant circuits.

What is claimed is:

1. In a Butler oscillator, the improvement comprising:
an amplitude limiting differential amplifier having an input connected to an output of a voltage amplifier stage of said oscillator, said limiting amlifier having a first output connected in a feedback path of said oscillator to a filter, said filter being connected to an input of an impedance matching stage of said oscillator and said amplifier having a second output of a portion of said amplifier outside said feedback path, said second output being connected to a signal output terminal for providing a square wave output signal from said oscillator.

2. The oscillator of claim 1 wherein said filter is a parallel resonant tank circuit having one terminal connected to an output of said differential amplifier and said input of said impedance matching stage and another terminal connecting through a substantially low alternating current impedance to ground.

3. The oscillator of claim 2 wherein a voltage attenuator is interposed in the connection path between said one terminal of said tank circuit and said input of said impedance matching stage.

4. The oscillator of claim 3 wherein said differential amplifier includes a first input connected to said output of said voltage amplifier stage and a second input connected to an output of another stage configured substantially the same as said voltage amplifier stage.

5. An oscillator circuit comprising:
a voltage amplification stage having an input and an output;
an amplitude limiting differential amplifier stage having a first output and having an input connected to said output of said voltage amplification stage, said first output and said input of said amplifier being connected in a feedback path of said oscillator;
an impedance matching stage having an input and an output;
a filter connecting said first output of said amplitude limiting stage and said input of said impedance matching stage, said filter being operative to provide a relatively pure, sinusoidal waveform to said input of said impedance matching stage; and
a series of resonant circuit connecting said output of said impedance matching stage to said input of said voltage amplification stage; and
said differential amplifier having a second output of a portion of said amplifier outside said feedback path, said second output being connected to a signal output terminal for providing a square wave output signal from said oscillator.

6. The oscillator of claim 5 wherein said filter is a parallel resonant tank circuit having one terminal connected to an output of said differential amplifier and said input of said impedance matching stage and another terminal connected through a substantially low alternating current impedance to ground.

7. The oscillator of claim 6 wherein a voltage attenuator is interposed in the connection path between said one terminal of said tank circuit and said input of said impedance matching stage.

8. The oscillator of claim 7 wherein said differential amplifier includes a first input connected to said output of said voltage amplifier stage and a second input connect to an output of another stage configured substantially the same as said voltage amplifier stage.

9. The oscillator of claim 8 wherein said series resonant circuit is a piezoelectric crystal.

* * * * *